United States Patent
Kim

(10) Patent No.: US 10,636,863 B2
(45) Date of Patent: Apr. 28, 2020

(54) ORGANIC LIGHT EMITTING DISPLAY DEVICE

(71) Applicant: LG Display Co., Ltd., Seoul (KR)

(72) Inventor: Eunah Kim, Osan-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/195,455

(22) Filed: Nov. 19, 2018

(65) Prior Publication Data

US 2019/0165077 A1    May 30, 2019

(30) Foreign Application Priority Data

Nov. 30, 2017    (KR) .................. 10-2017-0162454

(51) Int. Cl.
*H01L 27/32* (2006.01)
*H01L 51/00* (2006.01)
*H01L 51/52* (2006.01)

(52) U.S. Cl.
CPC ...... *H01L 27/3276* (2013.01); *H01L 27/3258* (2013.01); *H01L 51/0097* (2013.01); *H01L 51/5253* (2013.01)

(58) Field of Classification Search
CPC .................. H01L 27/3276; H01L 51/0097
See application file for complete search history.

(56) References Cited

U.S. PATENT DOCUMENTS

| | | | |
|---|---|---|---|
| 9,601,557 B2 | 3/2017 | Yang et al. | |
| 9,608,215 B2 | 3/2017 | Minami et al. | |
| 9,755,168 B2 | 9/2017 | Minami et al. | |
| 9,818,974 B2 | 11/2017 | Kwon et al. | |
| 10,069,092 B2 | 9/2018 | Minami et al. | |
| 10,224,344 B2 | 3/2019 | Lee et al. | |
| 10,276,814 B2 | 4/2019 | Minami et al. | |
| 10,396,141 B2 | 8/2019 | Kawata | |
| 2012/0146886 A1 | 6/2012 | Minami et al. | |
| 2014/0138637 A1 | 5/2014 | Yang et al. | |
| 2014/0217373 A1 | 8/2014 | Youn et al. | |
| 2014/0232956 A1* | 8/2014 | Kwon ............... | G02F 1/133305 349/12 |
| 2016/0172427 A1 | 6/2016 | Lee et al. | |
| 2016/0174304 A1 | 6/2016 | Kim et al. | |
| 2016/0181346 A1* | 6/2016 | Kwon ................. | H01L 27/3276 257/40 |
| 2017/0155066 A1 | 6/2017 | Minami et al. | |

(Continued)

FOREIGN PATENT DOCUMENTS

| | | |
|---|---|---|
| JP | 2012-128006 A | 7/2012 |
| JP | 2016-503515 A | 2/2016 |

(Continued)

OTHER PUBLICATIONS

Japan Patent Office, Notice of Reasons for Refusal, JP Patent Application No. 2018-218089, dated Dec. 24, 2019, 12 pages.

*Primary Examiner* — Jamie C Niesz
(74) *Attorney, Agent, or Firm* — Fenwick & West LLP

(57) ABSTRACT

An organic light emitting display device is disclosed, which enhances an adhesion between a substrate and a routing line and minimizes a crack of the routing line. The organic light emitting display device comprises a substrate having a display area and a bending area; a routing line arranged on the bending area of the substrate; and a lower layer formed between the substrate and the routing line.

9 Claims, 3 Drawing Sheets

(56) References Cited

U.S. PATENT DOCUMENTS

| | | | |
|---|---|---|---|
| 2017/0170206 A1 | 6/2017 | Lee et al. | |
| 2017/0179423 A1 | 6/2017 | Kwon et al. | |
| 2017/0288005 A1 | 10/2017 | Kawata | |
| 2017/0301266 A1 | 10/2017 | Zhang et al. | |
| 2017/0302772 A1 | 10/2017 | Zhang et al. | |
| 2017/0323779 A1 | 11/2017 | Um et al. | |
| 2018/0331309 A1 | 11/2018 | Minami et al. | |
| 2019/0157312 A1 | 5/2019 | Lee et al. | |
| 2019/0189639 A1* | 6/2019 | Zuo | H01L 27/1248 |
| 2019/0214588 A1 | 7/2019 | Minami et al. | |
| 2019/0333981 A1 | 10/2019 | Kawata | |

FOREIGN PATENT DOCUMENTS

| | | |
|---|---|---|
| JP | 2016-031499 A | 3/2016 |
| JP | 2017-111435 A | 6/2017 |
| JP | 2017-111437 A | 6/2017 |
| JP | 2017-187580 A | 10/2017 |
| JP | 2018-180413 A | 11/2018 |
| KR | 2014-0099139 A | 8/2014 |

\* cited by examiner

ORGANIC LIGHT EMITTING DISPLAY DEVICE

CROSS-REFERENCE TO RELATED APPLICATIONS

This application claims priority to Republic of Korea Patent Application No. 10-2017-0162454 filed on Nov. 30, 2017, which is hereby incorporated by reference in its entirety.

BACKGROUND

Technical Field

The present disclosure relates to an organic light emitting display device.

Description of the Related Art

With the advancement of the information age, a demand for a display device for displaying an image has been increased in various forms. Among display devices, an organic light emitting display device is a self-light emitting device, and has received attention as a next generation display device owing to advantages such as a wide viewing angle, an excellent contrast ratio and a fast response speed. Recently, an organic light emitting display device of a slimmer size has been realized. Particularly, a flexible organic light emitting display device has many advantages in that it is easy to carry and may be applied to various shaped devices.

Since a flexible organic light emitting display device includes a bending area that may a foldable substrate and may reduce a bezel size by folding the substrate at the bending area, an organic light emitting display device having a narrow bezel may be realized. However, if bending is increased, a buffer layer and an insulating layer, which are vulnerable to stress, are broken, and a crack is generated in a routing line, whereby a problem occurs with disconnection.

To solve the problem, when the buffer layer and the insulating layer are removed from the bending area, the bending of the flexible display may easily be performed but problems occurs such as a film gap generated due to a low adhesion between the routing line and the substrate.

SUMMARY

The present disclosure has been made in view of the above problems, and it is an object of the present disclosure to provide an organic light emitting display device that enhances adhesion between a substrate and a routing line and minimizes occurrence of cracks in the routing line.

In accordance with an aspect of the present disclosure, the above and other aspects can be accomplished by an organic light emitting display device comprising a substrate having a display area and a bending area; a routing line arranged on the bending area of the substrate; and a lower layer formed between the substrate and the routing line.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings.

DETAILED DESCRIPTION DISCLOSURE

Figure 1:
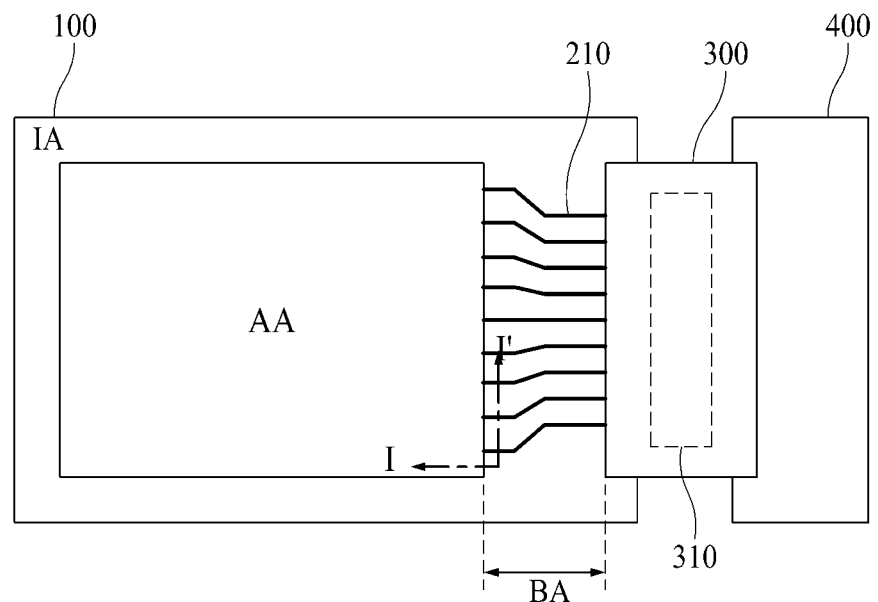
FIG. 1 is a plane view illustrating an organic light emitting display device according to an embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only' is used. The terms of a singular form may include plural forms unless referred to the contrary.

In construing an element, the element is construed as including an error range although there is no explicit description.

In describing a positional relationship, for example, when the positional relationship is described as 'upon', 'above', 'below', and 'next to', one or more portions may be arranged between two other portions unless 'just' or 'direct' is used.

In describing a time relationship, for example, when the temporal order is described as 'after', 'subsequent', 'next', and 'before', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"A first horizontal-axis direction", "a second horizontal-axis direction" and "a vertical-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiments of the present disclosure of a multi-film and an organic light emitting display device according to the present disclosure will be described in detail with reference to the accompanying drawings. Wherever possible, the same reference numbers will be used throughout the drawings to refer to the same or like parts.

Figure 2:
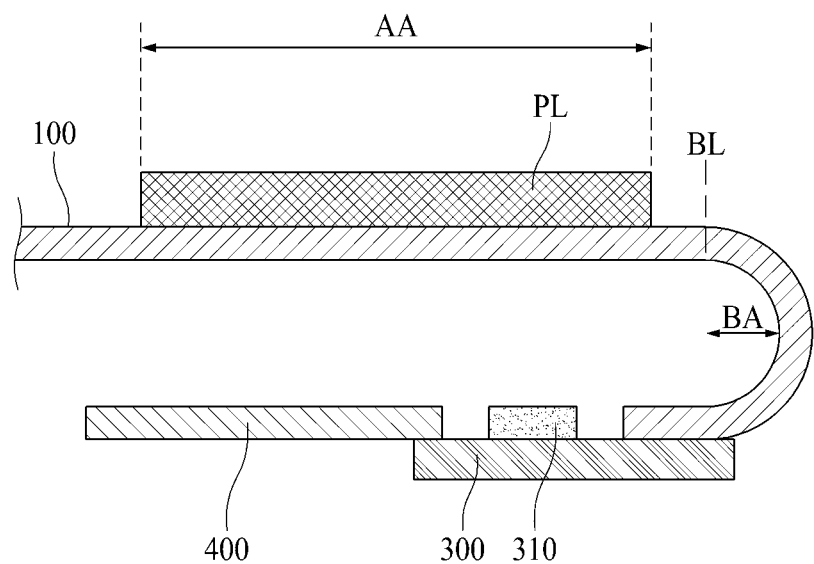
FIG. 2 is a cross-sectional view illustrating the organic light emitting display device of FIG. 1 being bent.

FIG. 1 is a plane view illustrating an organic light emitting display device according to one embodiment of the present disclosure, and FIG. 2 is a cross-sectional view illustrating that an organic light emitting display device of FIG. 1 is bent.

Referring to FIGS. 1 and 2, the organic light emitting display device according to one embodiment of the present disclosure includes a substrate 100, a pixel array layer PL, a driver 300, and a circuit board 400.

The substrate 100 is a thin film transistor array substrate, and may be made of a glass or plastic material. The substrate 100 includes a display area AA and a non-display area IA.

The display area AA is provided at the middle portions excluding an edge portion of the substrate 100. The display area AA may be defined as an area where a pixel array layer PL for displaying an image is arranged.

The non-display area IA is provided at the circumference portions excluding the display area AA provided in the substrate 100, and may be defined as the edge portions of the substrate 100 surrounding the display area AA. The non-display area IA is in the periphery outside the display area AA, does not display an image unlike the display area AA, and includes a bending area BA connected with the driver 300.

The bending area BA is an area arranged within the non-display area IA, and is an area where a routing line 210 for connecting the driver 300 with the pixel array layer PL is arranged. The bending area BA is an area provided to fold a part of the non-display area IA in one direction, and serves to reduce a bezel of the organic light emitting display device according to the present disclosure. The bending area BA has a structure for facilitating bending, which will be described later.

The pixel array layer PL is provided on the display area AA of the substrate 100. The pixel array layer PL is connected with the driver 300 through the routing line 210, and displays an image by receiving image data supplied from a display driving system. A detailed structure of the pixel array layer PL will be described later.

The driver 300 is connected to a pad portion provided in the non-display area IA of the substrate 100, and displays an image corresponding to the image data supplied from the display driving system. The driver 300 includes a driving circuit 310, and may be a chip on film structure. For example, the driver 300 may comprise a flexible film, a driving circuit 310 on the flexible film, and a plurality of driving terminals arranged at one edge of the flexible film.

The circuit board 400 is electrically connected with the driver 300. The circuit board 400 serves to transfer signals and power sources between elements of the driver 300. The circuit board 400 may be a printed circuit board having flexibility.

Referring to FIG. 2 again, the substrate 100 may fold at the bending area BA in one direction. In this case, a bending line BL may be arranged at an interval spaced apart from the edge of the pixel array layer PL formed on the substrate 100. The bending line BL may be a line for folding the substrate 100. The organic light emitting display device according to the present disclosure has a minimized bezel as the bending line BL is arranged to adjoin the edge of the pixel array layer PL. The non-display area shown in front of the display is defined as the bezel. The bending area BA including the non-display area IA is not shown in front of the display. As the bending line BL is getting closer to the edge of the pixel area layer PL, the area of bezel is getting smaller.

Figure 3:
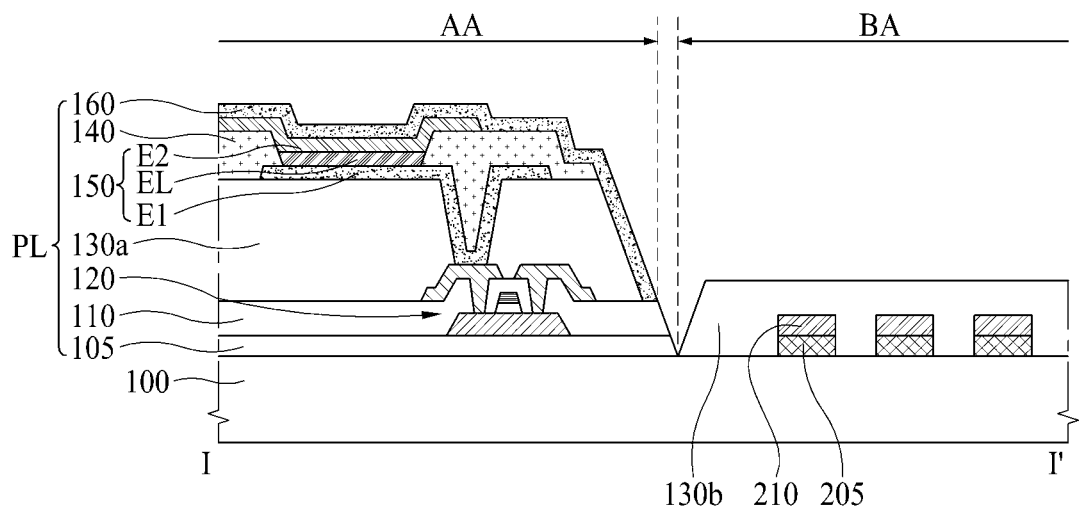
FIG. 3 is a cross-sectional view taken along line I-I' of FIG. 1 according to the first embodiment of the present disclosure.

FIG. 3 is a cross-sectional view taken along line I-I' of FIG. 1 according to the first embodiment of the present disclosure.

Referring to FIG. 3, the organic light emitting display device according to the first embodiment includes a substrate 100, a pixel array layer PL, a routing line 210, a lower layer 205, and a second planarization layer 130b.

The substrate 100 is a thin film transistor array substrate, and may be made of a glass or plastic material. The substrate 100 includes a display area AA and a bending area BA.

The pixel array layer PL is provided on the display area AA. The pixel array layer PL includes a buffer layer 105, a thin film transistor 120, a first planarization layer 130a, a bank layer 140, a light emitting diode layer 150, and an encapsulation layer 160.

The buffer layer 105 is provided on the display area AA of the substrate 100. The buffer layer 105 serves to prevent water from being permeated into the pixel array layer PL. The buffer layer 105 may be made of, but not limited to, an inorganic insulating material, for example, SiO2 (silicon dioxide), SiNx (silicon nitride), or multiple layer of SiO2 and SiNx.

The thin film transistor 120 is provided on the buffer layer 105. The thin film transistor 120 controls the amount of a current flowing from the driver 300 to the light emitting diode. To this end, the thin film transistor 120 includes a gate electrode, a drain electrode, and a source electrode. The thin film transistor 120 may drive the light emitting diode to emit light at the brightness proportional to a data signal supplied from a data line by controlling a data current flowing from the driver 300 to the light emitting diode.

The thin film transistor 120 may include an insulating layer 110 covering the gate electrode. The insulating layer 110 may be made of a single layer or multiple layers of an inorganic material, for example, SiOx (silicon oxide), SiNx (silicon nitride), etc.

The first planarization layer 130a is provided on the display area AA of the substrate 100 to cover the thin film transistor 120. The first planarization layer 130a provides a planarization surface on the thin film transistor 120 while protecting the thin film transistor 120. The first planarization layer 130a may be made of an organic material such as benzocyclobutene and photo acryl, but may preferably be made of a photo acrylic material for convenient of processing.

The bank layer 140 is provided on the first planarization layer 130a to define an opening area. The bank layer 140 may include an organic material such as benzocyclobutadiene, acryl, or polyimide. Additionally, the bank layer 140 may be formed of a photoresist material containing a black pigment. In this case, the bank layer 140 serves as a light-shielding member (or black matrix).

The light emitting diode layer 150 emits light in accordance with the data signal supplied from the thin film transistor. The light emitted from the light emitting diode layer 150 is extracted to the outside by passing through the substrate 100. The light emitting diode layer 150 may include a first electrode E1 connected to the thin film transistor, a light emitting layer EL formed on the first electrode E1, and a second electrode E2 formed on the light emitting layer EL.

The first electrode E1 is an anode electrode, and is provided on the first planarization layer 130a in a patterned shape. The first electrode E1 receives the data current output from the thin film transistor by being electrically connected with source/drain electrodes of the thin film transistor through a contact hole provided in the first planarization layer 130a. The first electrode E1 may be made of a metal material having high reflectivity, and for example, may include, but is not limited to, a material such as Au, Ag, Al, Mo, Mg, or their alloy.

The light emitting layer EL is provided on the first electrode E1 of the opening area defined by the bank layer 140. The light emitting layer EL may include a hole injecting layer, a hole transporting layer, an organic light emitting layer, an electron transporting layer, and an electron injecting layer, which are sequentially deposited on the first electrode E1. In this case, one or more of the hole injecting layer, the hole transporting layer, the electron transporting layer and the electron injecting layer may be omitted. Also, the light emitting layer EL may further include at least one function layer for controlling electrons and/or holes injected into the organic light emitting layer.

The second electrode E2 is provided on the substrate 100 to cover the light emitting layer EL and the bank layer 140, and is connected with the light emitting layer EL. The second electrode may be defined as a cathode electrode or a common electrode (which is commonly connected to all light emitting diodes) in accordance with a direction of a current flowing to the light emitting layer EL. The second electrode E2 receives a cathode power source supplied from the driver 300. In this case, the cathode power source may be a ground voltage or a direct current voltage having a predetermined level.

The second electrode E2 may be made of a transparent metal material having high light transmittance. For example, the second electrode E2 may include ITO (indium tin oxide), IZO (indium zinc oxide), IZTO (indium zinc tin oxide), ICO (indium cesium oxide) or IWO (indium tungsten oxide), which is a transparent conductive material such as TCO (transparent conductive oxide). Selectively, in this embodiment, to minimize damage of the light emitting layer EL due to a process temperature when the second electrode E2 is formed, the second electrode E2 may be formed of an amorphous transparent conductive material by a low temperature metal deposition process having a process temperature less than 100° C. That is, when the second electrode E2 is formed of a crystalline transparent conductive material, a problem occurs in that the light emitting layer EL is damaged by a high temperature heat treatment process performed for the second electrode E2 to obtain a low resistance value. Therefore, it is preferable that the second electrode E2 is formed of an amorphous transparent conductive material by a low pressure metal deposition process.

The encapsulation layer 160 is provided on the light emitting diode layer 150 to protect the light emitting layer EL which is vulnerable to external water or oxygen by preventing water from permeating into the light emitting layer EL. That is, the encapsulation layer 160 is provided on the substrate 100 to cover the second electrode E2. The encapsulation layer 160 may be formed of an inorganic layer or organic layer, or may be formed of a multi-layered structure in which the inorganic layer and the organic layer are deposited alternately.

The routing line 210 is provided on the bending area BA of the substrate 100. The routing line 210 serves to electrically connect the driver 300 with the pixel array layer PL, and may be formed of a metal line. The routing line 210 may be formed of a linear metal line to have a fine pattern corresponding to UHD (Ultra High Density) design of the organic light emitting display device. Since the routing line 210 should transmit a data signal to the pixel array layer PL within a limited space, a line width and a line interval may be 2 µm to 4 µm.

The lower layer 205 is provided on the bending area BA of the substrate 100. The lower layer 205 is formed between the substrate 100 and the routing line 210. The lower layer 205 may be made of, but not limited to, an inorganic insulating material, for example, SiO2 (silicon dioxide), SiNx (silicon nitride), or a multiple layers of SiO2 and SiNx. The lower layer 205 serves to prevent water from being permeated into the routing line 210.

The lower layer 205 may enhance adhesion between the substrate 100 and the routing line 210. The substrate 100 may be formed of a plastic based material having nitrogen. At this time, since nitrogen does not have a good adhesion with the routing line 210 made of a metal material, a problem occurs in that decoupling may occur during a later process. However, the lower layer 205 is formed of an inorganic insulating material such as SiO2 and SiNx, and the inorganic insulating material has a good adhesion with nitrogen and also has a good adhesion with the routing line 210 made of a metal material. Since the lower layer 205 is interposed between the substrate 100 and the routing line 210, the substrate 100 is indirectly coupled with the routing line 210 through the lower layer 205 formed on the substrate 100, and adhesion may be enhanced.

The lower layer 205 is formed such that its front surface (or upper surface) is overlapped (or contacted) with a rear surface (or lower surface) of the routing line 210. When the lower layer 205 is formed to be provided on an entire surface of the bending area BA, a crack may be generated in the lower layer 205 by stress applied to the lower layer 205 during bending. In the organic light emitting display device according to the present disclosure, since the lower layer 205 is formed in an area overlapped with the routing line 210 and not on the entire surface of the bending area BA, but in a patterned shape, relatively less stress is applied to the lower layer 205, and a crack may be prevented from being generated in the lower layer 205 during the bending process.

The lower layer 205 may be formed to have the same width as that of the routing line 210. Since the lower layer 205 is formed of an inorganic insulating material, a crack may be generated by external impact. In the organic light emitting display device according to the present disclosure, since the lower layer 205 is formed to have the same width as that of the routing line 210, the upper portion of the lower layer 205 is overlapped with the routing line 210. In this case, since the routing line 210 is formed of a metal material, the routing line 210 easily tolerates external impact and serves as a buffering member that absorbs impact applied to the lower layer 205, whereby a crack may be prevented from being generated in the lower layer 205.

In the organic light emitting display device according to the present disclosure, since the lower layer 205 is formed in only the area overlapped with the routing line 210, impact applied to the lower layer 205 may be absorbed by the routing line 210, and a disconnection of the routing line 210, which is caused by a crack generated in the lower layer 205, may be avoided. Also, the lower layer 205 is formed of an inorganic insulating material that may enhance adhesion between the substrate 100 and the routing line 210. Therefore, a peeling-off of the routing line 210 caused by bad adhesion when the routing line 210 is formed on the substrate 100 may be prevented.

The second planarization layer 130b is provided to cover the routing line 210. The second planarization layer 130b provides a planarization surface on the routing line 210 while protecting the routing line 210. The second planarization layer 130b according to one embodiment is made of the same organic material as that of the first planarization layer 130a, and is patterned during a deposition process for forming the first planarization layer 130a and thus formed together with the first planarization layer 130a.

The second planarization layer 130b may prevent a crack from being generated during bending by providing a planarization surface on the routing line 210. Since the routing line 210 is formed to be spaced apart from another routing line 210, a step difference is generated in the bending area BA due to formation of the routing line 210, whereby stress generated during bending may be increased. Since the second planarization layer 130b provides the planarization surface on the routing line 210, the step difference may be prevented from being generated in the bending area BA and a crack may be prevented from being generated in the bending area BA.

The second planarization layer 130b is formed to cover the upper surface and the side surface (or side wall) of the lower layer 205, and is formed to be directly in contact with the substrate 100 in the area where the lower layer 205 and the routing line 210 are not formed. Since the lower layer 205 is formed to have the same width as that of the routing line 210 without being provided on the entire surface of the bending area BA, some areas of the bending area, where the lower layer 205 and the routing line 210 are not formed, are covered by the second planarization layer 130b. The second planarization layer 130b may be formed of a material, which may prevent water permeation from occurring, to protect the routing line 210 from external water or particles.

Figure 4:
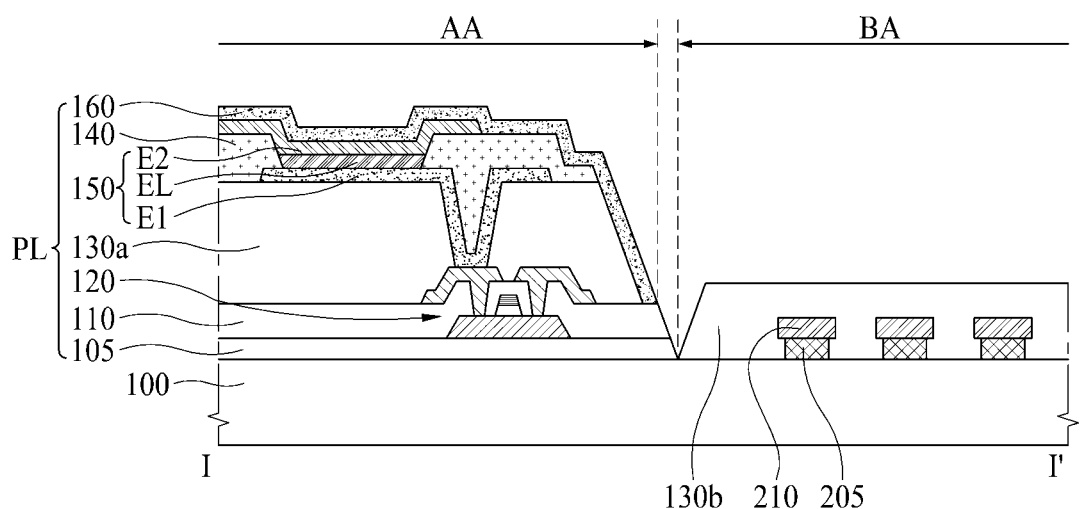
FIG. 4 is a cross-sectional view taken along line I-I' of FIG. 1 according to the second embodiment of the present disclosure.

FIG. 4 is a cross-sectional view taken along line I-I' of FIG. 1 according to the second embodiment of the present disclosure. FIG. 4 corresponds to a structure that a width of the lower layer is different from that of FIG. 3, and thus a description repeated with FIG. 3 will be omitted.

Referring to FIG. 4, the lower layer 205 may be formed to have a width smaller than that of the routing line 210.

Since the lower layer 205 is formed of an inorganic insulating material, the lower layer 205 may be vulnerable to stress and a crack may be generated in the lower layer 205 by external impact. In the embodiment illustrated in FIG. 4, since the routing line 210 is formed of a metal material, the routing line 210 may serve as a buffering member that is easy to tolerate external impact and absorbs impact applied to the lower layer 205. Since the lower layer 205 is formed to have a width smaller than that of the routing line 210, the routing line 210 may primarily absorb impact transferred from the side. When the lower layer 205 is formed to have a width smaller than that of the routing line 210 as above, since the routing line 210 may absorb impact transferred from the side as well as impact transferred up and down, a crack may be prevented from being generated in the lower layer 205.

Figure 5:
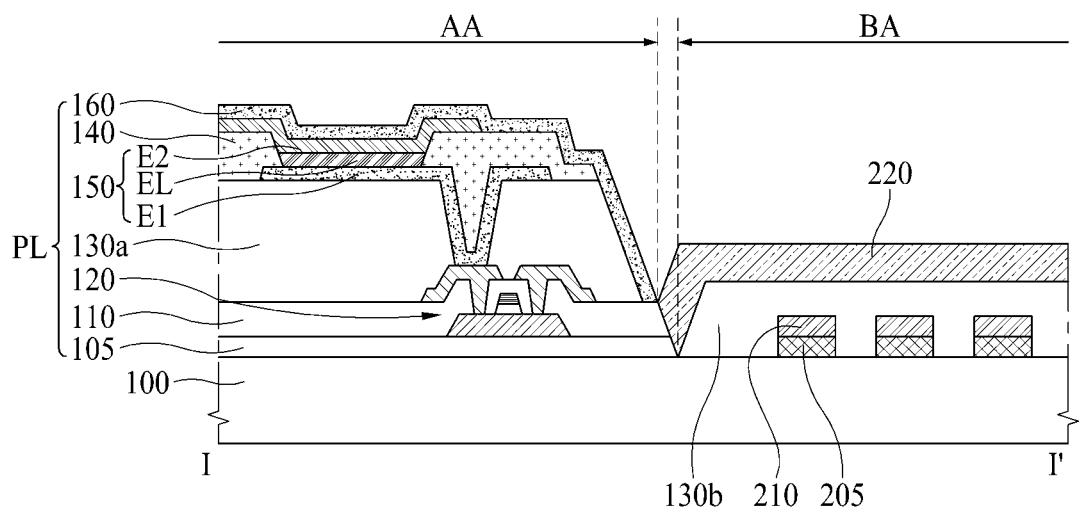
FIG. 5 is a cross-sectional view taken along line I-I' of FIG. 1 according to the third embodiment of the present disclosure.
Figure 6:
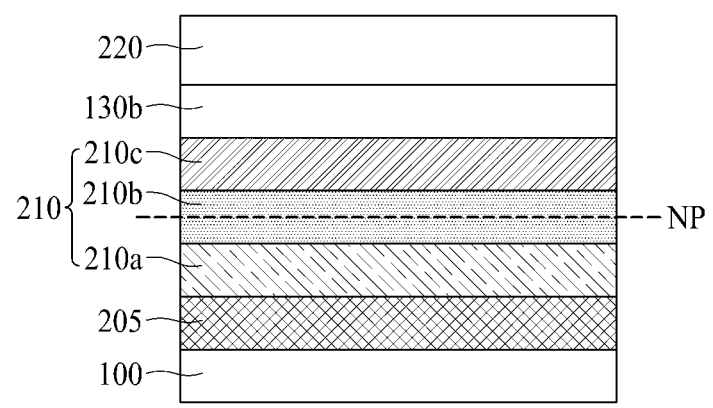
FIG. 6 is an enlarged view illustrating a structure of an area where a routing line is formed in FIG. 5.

FIG. 5 is a cross-sectional view taken along line I-I' of FIG. 1 according to the third embodiment of the present disclosure, and FIG. 6 is an enlarged view illustrating a structure of an area where a routing line is formed in FIG. 5. FIG. 5 relates to a structure where a micro-coating layer is added to a structure of FIG. 4, and thus a description describing features already discussed from FIG. 4 may be omitted.

Referring to FIGS. 5 and 6, the organic light emitting display device according to the third embodiment of the present disclosure includes a routing line 210, and a micro-coating layer 220.

The routing line 210 is provided on the bending area BA of the substrate 100. The routing line 210 includes a first metal 210a, a second metal 210b and a third metal 210c.

The first metal 210a is provided to be directly in contact with the lower layer 205 at the lowest portion of the routing line 210. The first metal 210a may be formed of a metal such as Ti having high strength, and may protect the routing line 210 from external impact.

The second metal 210b is provided on the first metal 210a. The second metal 210b may be formed of a metal such as Al having good ductility and flexibility. The second metal 210b is formed to be thicker than the first metal 210a and the third metal 210c.

The third metal 210c is provided on the second metal 210b. The third metal 210c may be formed of the same material as that of the first metal 210a to protect the routing line 210 from external impact, and is preferably formed of the same thickness as that of the first metal 210a.

The micro-coating layer 220 is provided on the entire surface of the bending area BA of the substrate 100 to cover the second planarization layer 130b. The micro-coating layer 220 may be provided as a photo-hardening resin, and may be coated on target areas of the organic light emitting display device according to the present disclosure. In this respect, the micro-coating layer 220 may be coated on the entire surface of the bending area BA.

The micro-coating layer 220 may be coated at a predetermined thickness to adjust the position of a neutral plane NP at the bending area BA of the substrate 100 in the organic light emitting display device according to the present disclosure. In detail, in the organic light emitting display device, the neutral plane NP of the bending area BA may be adjusted to be disposed on the routing line 210. One surface of the substrate 100 is stretched and the other surface is shrunk as the substrate 100 is bent. At this time, the surface which is neither stretched nor shrunk, and which is defined at the center of the substrate 100, is defined as the middle plane or the neutral plane. In this case, the neutral plane NP is formed or defined on the bending area BA of the organic light emitting display device.

For example, as the micro-coating layer 220 is thickly coated, the neutral plane NP ascends toward the upper portion from the substrate 100, whereby the neutral plane NP may be arranged at (on or in) the routing line 210. Since the routing line 210 is formed of a metal material, the routing line 210 is vulnerable to bending stress generated during bending, whereby disconnection may be occurred. In this case, when the neutral plane NP is arranged at the routing line 210, bending stress applied to the routing line 210 is minimized, because the neutral plane NP is neither stretched nor shrunk. Therefore, a disconnection defect on the routing line 210 does not occur. As a result, the extreme bending of the organic light emitting display device may be acquired and a narrow bezel may be realized.

Also, the neutral plane NP may be arranged in the second metal 210b even within the routing line 210. The second metal 210b is formed of a material having high ductility, and serves to transmit a data signal to the pixel array layer PL. Since the second metal 210b is a direct factor that may cause disconnection, it is favorable for situations of extreme bending that the neutral plane NP is arranged at (on or in) the second metal 210b.

In the organic light emitting display device according to the present disclosure, the micro-coating layer 220 may be formed on the bending area BA to adjust the neutral plane NP of the bending area BA. Therefore, stress applied to the bending area BA may be suppressed to enable extreme bending.

As described above, according to the present disclosure, the following effects and advantages may be obtained.

The organic light emitting display device according to the present disclosure may prevent a defect from a film gap between the substrate and the routing line from being generated while facilitating bending.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display device comprising:
   a substrate having a display area and a bending area;
   a routing line arranged on the bending area of the substrate, the routing line having a length along a first direction and a width along a second direction that is different from the first direction, wherein the routing line is separated from another routing line in the second direction; and
   a lower layer formed between the substrate and the routing line, the lower layer having a length along the first direction and a width along the second direction, wherein the width of the lower layer in the second direction is less than the width of the routing line in the second direction,
   wherein the lower layer has a front surface overlapped with a rear surface of the routing line.

2. The organic light emitting display device according to claim 1, wherein the lower layer includes an inorganic insulating material.

3. The organic light emitting display device according to claim 1, further comprising:
   a pixel array layer provided on the display area of the substrate,
   wherein the pixel array layer includes:
   a thin film transistor for controlling a data current flowing to a light emitting diode;
   a first planarization layer for covering the thin film transistor;
   a light emitting diode layer provided on the first planarization layer and connected to the thin film transistor; and
   an encapsulation layer for covering the light emitting diode layer.

4. The organic light emitting display device according to claim 3, further comprising a second planarization layer for covering a side surface of the lower layer and the routing line, wherein the first planarization layer and the second planarization layer are formed of a same material.

5. The organic light emitting display device according to claim 4, wherein the second planarization layer is directly in contact with the substrate.

6. The organic light emitting display device according to claim 4, further comprising a micro-coating layer provided on the second planarization layer in the bending area without extending to the display area.

7. The organic light emitting display device according to claim 6, wherein a neutral plane of the bending area is arranged on the routing line.

8. The organic light emitting display device according to claim 6, wherein a neutral plane of the bending area is arranged in the routing line.

9. The organic light emitting display device according to claim 7, wherein the routing line includes:
   a first metal on the substrate;
   a second metal on the first metal; and
   a third metal on the second metal,
   wherein the neutral plane is arranged on or in the second metal.

* * * * *